(12) United States Patent
Choi et al.

(10) Patent No.: US 12,255,386 B2
(45) Date of Patent: Mar. 18, 2025

(54) ANTENNA PACKAGE AND IMAGE DISPLAY DEVICE INCLUDING THE SAME

(71) Applicant: DONGWOO FINE-CHEM CO., LTD., Jeollabuk-do (KR)

(72) Inventors: Byung Jin Choi, Incheon (KR); Jae Hyun Lee, Gyeonggi-do (KR); Hee Jun Park, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 176 days.

(21) Appl. No.: 17/973,808

(22) Filed: Oct. 26, 2022

(65) Prior Publication Data

US 2023/0052092 A1 Feb. 16, 2023

Related U.S. Application Data

(63) Continuation of application No. PCT/KR2021/004982, filed on Apr. 21, 2021.

(30) Foreign Application Priority Data

Apr. 28, 2020 (KR) .................. 10-2020-0051505

(51) Int. Cl.
*H01Q 1/38* (2006.01)
*H01Q 1/24* (2006.01)

(52) U.S. Cl.
CPC ............. *H01Q 1/38* (2013.01); *H01Q 1/243* (2013.01)

(58) Field of Classification Search
CPC ................................. H01Q 1/38; H01Q 1/243
See application file for complete search history.

(56) References Cited

U.S. PATENT DOCUMENTS

| 2007/0138654 A1 | 6/2007 | Kim |
| 2019/0104212 A1* | 4/2019 | Lee ............... H01Q 9/0435 |
| 2019/0113609 A1* | 4/2019 | Baheti ............ H01Q 9/0457 |
| 2021/0044028 A1* | 2/2021 | Lee ............... H01Q 21/08 |

FOREIGN PATENT DOCUMENTS

| CN | 215119243 U | 12/2021 |
| JP | 2019-022067 A | 2/2019 |
| JP | 2019-054473 A | 4/2019 |
| KR | 10-2007-0012077 A | 1/2007 |

(Continued)

OTHER PUBLICATIONS

International Search Report for PCT/KR2021/004982 mailed on Aug. 4, 2021.

(Continued)

*Primary Examiner* — Dieu Hien T Duong
(74) *Attorney, Agent, or Firm* — The PL Law Group, PLLC (57) ABSTRACT

An antenna package according to an embodiment includes antenna units, and a circuit board electrically connected to the antenna units. The circuit board includes a core layer, antenna feeding lines distributed on a surface of the core layer and connected to the antenna units, power/data lines distributed on the surface of the core layer, power/data ports connected to end portions of the power/data lines, and antenna feeding ports connected to end portions of the antenna feeding lines and arranged to be closer to the antenna units than the power/data ports.

18 Claims, 5 Drawing Sheets

(56) References Cited

FOREIGN PATENT DOCUMENTS

| KR | 10-2007-0064896 A | 6/2007 |
| KR | 10-2013-0095451 A | 8/2013 |
| KR | 10-2016-0080444 A | 7/2016 |
| KR | 10-1962820 B1 | 3/2019 |
| KR | 10-2019-0038264 A | 4/2019 |
| KR | 10-1962821 B1 | 7/2019 |

OTHER PUBLICATIONS

Office action issued on Mar. 20, 2024 from Korean Patent Office in a counterpart Korean Patent Application No. 10-2020-0051505 (English translation is also submitted herewith.).

* cited by examiner

ANTENNA PACKAGE AND IMAGE DISPLAY DEVICE INCLUDING THE SAME

CROSS-REFERENCE TO RELATED APPLICATION AND CLAIM OF PRIORITY

The present application is a continuation of application to International Application No. PCT/KR2021/004982 with an International Filing Date of Apr. 21, 2021, which claims the benefit of Korean Patent Applications No. 10-2020-0051505 filed on Apr. 28, 2020 at the Korean Intellectual Property Office (KIPO), the disclosures of which are incorporated by reference herein in their entirety.

BACKGROUND

1. Field

The present invention relates to an antenna package and an image display device including the same. More particularly, the present invention relates to an antenna package including an antenna device and a circuit board and an image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

As mobile communication technologies have been rapidly developed, an antenna capable of operating a high frequency or ultra-high frequency communication is needed in the image display device.

However, as a driving frequency of the antenna increases, a signal loss may also increase. Further, as a length of a transmission path increases, a degree of the signal loss may further increase.

When different circuits such as a power line, a data line connected to different antennas are included on one circuit board, a signal reliability may be degraded due to a mutual interference between the different circuits and the length of the transmission path may be increased to further result in the signal loss.

Thus, an antenna design to efficiently implement a circuit connection within a limited space while suppressing the signal loss from the antenna is needed. For example, Korean Patent Application Publication No. 2013-0095451 discloses an antenna integrated with a display panel, but the efficient circuit connection is not provided.

SUMMARY

According to an aspect of the present invention, there is provided an antenna package having improved operational reliability and signaling efficiency.

According to an aspect of the present invention, there is provided an image display device including an antenna package with improved operational reliability and signaling efficiency.

(1) An antenna package, including: antenna units; and a circuit board electrically connected to the antenna units, the circuit board including: a core layer; antenna feeding lines distributed on a surface of the core layer and connected to the antenna units; power/data lines distributed on the surface of the core layer; power/data ports connected to end portions of the power/data lines; and antenna feeding ports connected to end portions of the antenna feeding lines and arranged to be closer to the antenna units than the power/data ports.

(2) The antenna package according to the above (1), wherein the core layer includes a bonding region in which the antenna units and the antenna feeding lines are coupled, and a chip mounting region in which the antenna feeding ports and the power/data ports are distributed.

(3) The antenna package according to the above (2), wherein the antenna feeding ports are arranged at a front-end portion of the chip mounting region in a planar view, and the power/data ports are arranged at a rear-end portion of the chip mounting region in the planar view.

(4) The antenna package according to the above (3), wherein the chip mounting region has a first port row formed by the antenna feeding ports, and a second port row formed by the power/data ports and disposed behind the first port row with respect to the bonding region.

(5) The antenna package according to the above (4), wherein the chip mounting region includes at least two first port rows.

(6) The antenna package according to the above (3), further including an antenna driving integrated circuit chip having a ball grid array (BGA) structure mounted on the chip mounting region via the antenna feeding ports and the power/data ports.

(7) The antenna package according to the above (2), further including an antenna driving integrated circuit chip mounted on the chip mounting area in a form of a quad flat package (QFP) chip.

(8) The antenna package according to the above (7), wherein the antenna feeding ports and the power/data ports have lead shapes protruding from sides of the antenna driving integrated circuit chip in a planar view.

(9) The antenna package according to the above (8), wherein the antenna feeding ports are arranged at an upper side of the antenna driving integrated circuit chip, and the power/data ports are arranged at a lower side of the antenna driving integrated circuit chip.

(10) The antenna package according to the above (9), wherein the antenna feeding ports are also arranged at a lateral side of the antenna driving integrated circuit chip.

(11) The antenna package according to the above (10), wherein the power/data ports are also arranged at the lateral side of the antenna driving integrated circuit chip, and are disposed behind the antenna feeding ports with respect to the bonding region.

(12) The antenna package according to the above (2), wherein the core layer includes a first portion and a second portion having a width smaller than that of the first portion.

(13) The antenna package according to the above (12), wherein the chip mounting region is included in the first portion, and the power/data lines extend on the second portion.

(14) The antenna package according to the above (1), wherein the antenna units include a first antenna unit and second antenna unit having different sizes from each other.

(15) The antenna package according to the above (14), wherein the first antenna unit and the second antenna unit have different resonance frequencies.

(16) The antenna package according to the above (14), further including an antenna dielectric layer on which the antenna units are disposed, wherein the first antenna unit and the second antenna unit are alternately and repeatedly arranged along a width direction on the antenna dielectric layer.

(17) The antenna package according to the above (1), further including an antenna driving integrated circuit chip mounted on the power/data ports and the antenna feeding ports of the circuit board, wherein the shortest distance between the antenna driving integrated circuit chip and the antenna unit in a planar view is 20 mm or less.

(18) An image display device including the antenna package according to embodiments as described above.

According to embodiments of the present invention, antenna feeding ports may be arranged to be closer to a bonding region attached to an antenna unit than power/data ports in a chip mounting area of a circuit board connected to the antenna unit. Accordingly, power supply/signal loss transmitted from an antenna driving integrated circuit chip to the antenna unit may be reduced and an antenna gain may be increased.

Further, a power line and a data line included in the circuit board may be routed separately from an antenna feeding line, so that independence and reliability of a circuit connection may be improved without a mutual interference with circuits.

In some embodiments, the chip mounting region may be allocated on a first portion of a circuit board having a relatively large width, and the power line and the data line may extend on a second portion having a relatively small width. Accordingly, reliability and stability of a mounting process of the antenna driving integrated circuit chip may be enhanced, and the power line and the data line may be easily bent to be connected to, e.g., a main board of an image display device.

DETAILED DESCRIPTION OF THE EMBODIMENTS

According to exemplary embodiments of the present invention, there is provided an antenna package in which an antenna unit and a circuit board that may include circuit wirings and connection ports having different functions are combined with each other. Further, an image display device including the antenna package is also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

The terms "first", "second", "upper", "lower", "top", "bottom", etc., used in this application are not intended to designate an absolute position, but to relatively distinguish between different elements and positions.

Figure 1:
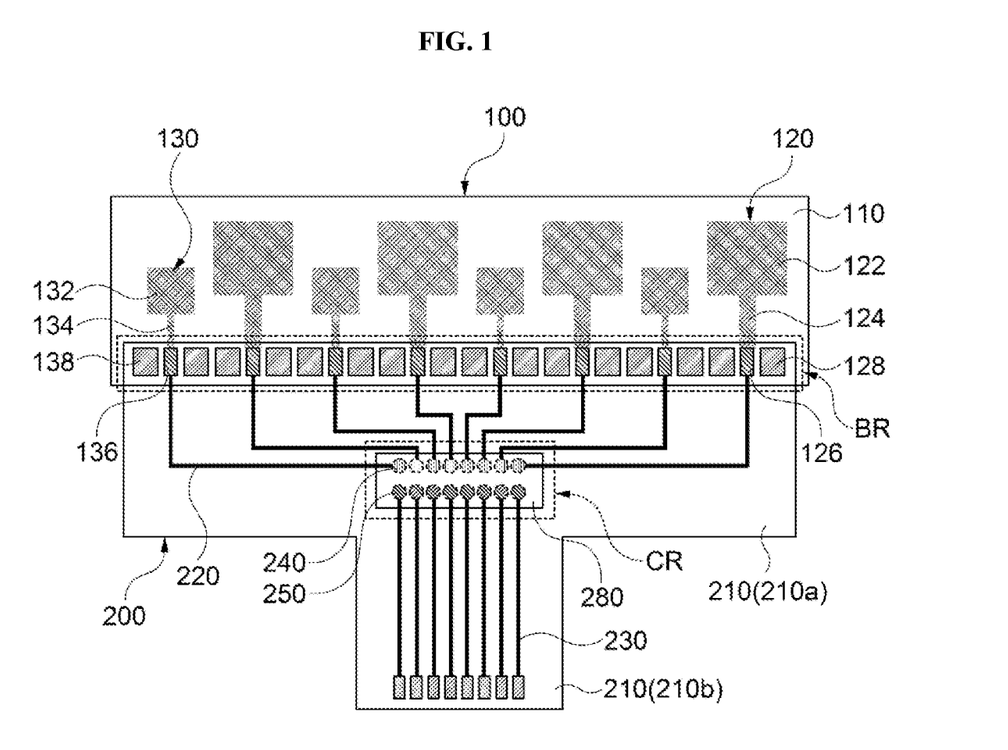
FIG. 1 is a schematic top planar view illustrating an antenna package in accordance with exemplary embodiments.

FIG. 1 is a schematic top planar view illustrating an antenna package in accordance with exemplary embodiments.

Referring to FIG. 1, an antenna package may include an antenna device 100 and a circuit board 200. The circuit board 200 may include an antenna feeding line 220 and a power/data line 230, and the antenna feeding line 220 may be electrically connected to an antenna unit included in the antenna device 100.

The antenna device may include an antenna dielectric layer 100 and antenna units 120 and 130 disposed on the antenna dielectric layer 100.

The antenna dielectric layer 110 may include, e.g., a transparent resin film such as a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more thereof.

The antenna dielectric layer 110 may include an adhesive film such as an optically clear adhesive (OCA), an optically clear resin (OCR), or the like. In some embodiments, the antenna dielectric layer 110 may include an inorganic insulating material such as glass, silicon oxide, silicon nitride, silicon oxynitride, etc.

In some embodiments, a dielectric constant of the antenna dielectric layer 110 may be adjusted in a range from about 1.5 to about 12. When the dielectric constant exceeds about 12, a driving frequency may be excessively decreased, so that driving in a desired high frequency or ultrahigh frequency band may not be implemented.

The antenna units 120 and 130 may be formed on a top surface of the antenna dielectric layer 110. For example, a plurality of the antenna units 120 and 130 may be formed in an array shape along a width direction of the antenna dielectric layer 110 or the antenna package to form an antenna unit row.

In some embodiments, the antenna units 120 and 130 may include first antenna units 120 and second antenna units 130, and the first antenna unit 120 and the second antenna units 130 may have different resonance frequencies.

The first antenna unit 120 may include a first radiator 122 and a first transmission line 124. The second antenna unit 130 may include a second radiator 132 and a second transmission line 134. The radiators 122 and 132 have, e.g., a polygonal plate shape, and the first and second transmission lines 124 and 134 may extend from a side of the first and second radiators 122 and 132, respectively. The transmission lines 124 and 134 may be formed as a single member substantially integral with the radiators 122 and 132.

The first antenna unit 120 and the second antenna unit 130 may further include a first signal pad 126 and a second signal pad 136, respectively. The first signal pad 126 and the second signal pad 136 may be connected to end portions of the first transmission line 124 and the second transmission line 134, respectively.

In an embodiment, the signal pads 126 and 136 may be substantially integral with the transmission lines 124 and 134, and the end portions of the transmission lines 124 and 134 may be provided as the signal pads 126 and 136.

In some implementations, ground pads 128 and 138 may be disposed around the signal pads 126 and 136. For example, a pair of first ground pads 128 may face each other with the first signal pad 126 interposed therebetween. A pair of second ground pads 138 may face each other with the second signal pad 136 interposed therebetween. The ground pads 128 and 138 may be electrically and physically separated from the transmission lines 124 and 134 and the signal pads 126 and 136.

In exemplary embodiments, the first antenna unit 120 and the second antenna unit 130 may have different sizes. In an embodiment, an area of the first radiator 122 included in the first antenna unit 120 may be larger than an area of the second radiator 132 included in the second antenna unit 130. In an embodiment, a length of the first transmission line 124 included in the first antenna unit 120 may be greater than a length of the second transmission line 134 included in the second antenna unit 130.

In exemplary embodiments, the first antenna unit 120 and/or the second antenna unit 130 may include an antenna pattern or a radiator capable of radiating at a high or ultra-high frequency band of 3G, 4G, 5G or more.

As described above, the first antenna unit 120 and the second antenna unit 130 may have different resonance frequencies. In exemplary embodiments, a resonance frequency of the first antenna unit 120 may be smaller than a resonant frequency of the second antenna unit 130.

As a non-limiting example, the resonance frequency of the first antenna unit 120 may be from about 20 to 30 GHz (e.g., 28 GHz), and a resonance frequency of the second antenna unit 130 may be from about 30 to 40 GHz (e.g., 38 GHz).

As illustrated in FIG. 1, the first antenna units 120 and the second antenna units 130 having different sizes and/or resonance frequencies may be alternately and repeatedly arranged in, e.g., a row direction. Accordingly, uniformity of radiation coverage may be improved throughout an entire area of the antenna device 100.

The first and second antenna units 120 and 130 may include silver (Ag), gold (Au), copper (Cu), aluminum (Al), platinum (Pt), palladium (Pd), chromium (Cr), titanium (Ti), Tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in combination thereof.

In an embodiment, the first and second antenna units 120 and 130 may include silver (Ag) or a silver alloy (e.g., silver-palladium-copper (APC)), or copper (Cu) or a copper alloy (e.g., a copper-calcium (CuCa)) to implement a low resistance and a fine line width pattern.

The first and second antenna units 120 and 130 may include a transparent conductive oxide such indium tin oxide (ITO), indium zinc oxide (IZO), zinc oxide (ZnOx), indium zinc tin oxide (IZTO), etc.

In some embodiments, the first and second antenna units 120 and 130 may include a stacked structure of a transparent conductive oxide layer and a metal layer. For example, the first and second antenna units 120 and 130 may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

In some embodiments, the radiators 122 and 132 and the transmission lines 124 and 134 may include a mesh-pattern structure to improve transmittance. In this case, a dummy mesh pattern (not illustrated) may be formed around the radiators 122 and 132 and the transmission lines 124 and 134.

The signal pads 126 and 136 and the ground pads 128 and 138 may be solid patterns formed of the above-described metal or alloy in consideration of reduction of a feeding resistance, improvement of noise absorption efficiency, horizontal radiation properties, etc.

The circuit board 200 may include a core layer 210 and circuit wirings formed on surfaces of the core layer 210. For example, the circuit board 200 may be a flexible printed circuit board (FPCB).

In some embodiments, the antenna dielectric layer 110 may be provided as the circuit board 200. In this case, the circuit board 200 (e.g., the core layer 210 of the circuit board 200) may be provided as a member substantially integral with the antenna dielectric layer 110. The antenna feeding line 220 that will be described later may be directly connected to the transmission lines 124 and 134, and the pads 126, 128, 136, and 138 may be omitted.

The core layer 210 may include, e.g., a flexible resin such as polyimide resin, Modified Polyimide (MPI), epoxy resin, polyester, cycloolefin polymer (COP), liquid crystal polymer (LCP), or the like. The core layer 210 may include an inner insulating layer included in the circuit board 200.

The circuit wirings may include the antenna feeding line 220 and the power/data line 230. The circuit wirings may be arranged on a surface of the core layer 210 (e.g., a surface facing the antenna units 120 and 130).

For example, the circuit board 200 may further include a coverlay film formed on the surface of the core layer 210 to cover the circuit wirings.

The antenna feeding line 220 may be connected or bonded to the signal pads 126 and 136 of the antenna units 120 and 130. For example, a portion of the coverlay film of the circuit board 200 may be removed to expose an end portion of the antenna feeding line 220. The exposed end portion of the antenna feeding line 220 may be bonded onto the signal pads 126 and 136.

For example, a conductive intermediate structure such as an anisotropic conductive film (ACF) may be attached to the signal pads 126 and 136, and then a bonding region BR of the circuit board 200 in which the end portions of the antenna feeding lines 220 are located may be disposed on the conductive intermediate structure. Thereafter, the bonding region BR of the circuit board 200 may be attached to the antenna device 100 by heating and pressurizing process, and the antenna feeding line 220 may be electrically connected to the signal pads 126 and 136.

The antenna feeding lines 220 may extend from the bonding region BR to a chip mounting region CR. The chip mounting region CR may be an area of the circuit board 200 in which an antenna driving integrated circuit (IC) chip 280 is mounted. Terminal ends of the antenna feeding lines 220 may be distributed in the chip mounting region CR.

In exemplary embodiments, an antenna feeding port 240 may be arranged in the chip mounting region CR. For example, a plurality of the antenna feeding ports 240 may be connected to each of the antenna feeding line 220. Accordingly, a power feeding may be performed to each of the antenna units 120 and 130 through each of the antenna feeding ports 240.

In some embodiments, a plurality of the antenna feeding ports 240 may form a first port row.

Power/data ports 250 may be further arranged in the chip mounting region CR. Each of the power/data ports 250 may be connected to the power/data line 230. The power/data ports 250 may be divided into a power port and a data port, and the power/data lines 230 may be divided into a power line and a data line. The power line and the data line may be connected to the power port and the data port, respectively.

The power line may receive a power from, e.g., a main board or a battery of the image display device, and may provide a driving power of the antenna driving IC chip 280. The data line may receive a control signal from a central processing unit (e.g., an application processor (AP) of a smartphone) mounted on the main board of the image display device to and may transfer to the antenna driving IC chip 280.

For example, the control signal may include an on/off signal of the antenna units 120 and 130, a switching signal (e.g., a switching signal between the first and second antenna units 120 and 130), an antenna beam tilting signal, a phase control signal, or the like.

In some embodiments, a plurality of the power/data ports 250 may form a second port row.

In exemplary embodiments, the antenna feeding ports 240 may be disposed to be closer to the bonding region BR than the power/data ports 250. For example, the first port row may be disposed at a front-end portion of the chip mounting area CR adjacent to the bonding region BR in a planar direction. The second port row may be disposed at a rear-end portion of the chip mounting region CR in the planar view.

Accordingly, a length of a feeding path transmitted from the antenna driving IC chip 280 to the antenna units 120 and 130 may be reduced, thereby suppressing a power loss occurring in the antenna feeding line 220. Accordingly, an antenna radiation of a desired resonance frequency from the antenna units 120 and 130 may be implemented while maintaining a sufficient gain.

The second port row receiving signals and power from the main board may be disposed at the rear-end portion of the chip mounting region CR, so that a power/data path may also be shortened. Additionally, the first and second port rows may be divided or separated from each other, so that circuit independence/reliability may be improved without a mutual interference between the antenna feeding line 220 and the power/data line 230.

The antenna driving IC chip 280 may be mounted on the chip mounting region CR, and may be electrically connected to the antenna units 120 and 130 and the main board (or AP) via the antenna feeding port 240 and the power/data port 250.

The antenna feeding ports 240 and the power/data ports 250 may be arranged in, e.g., a form of a ball grid array (BGA).

The terms "antenna feeding ports 240 and power/data ports 250" used in the present application refer to pads or ports included in the antenna driving IC chip 280, or terminals or pads of the circuit wirings 220 and 230 included in the circuit board 200.

In some embodiments, the circuit board 200 or the core layer 210 may include a first portion 210a and a second portion 210b having different widths, and the second portion 210b t may have a smaller width than that of the first portion 210a.

The chip mounting region CR may be included on the first portion 210a. Accordingly, durability against a stress generated during a surface mounting process for mounting the antenna driving IC chip 280 may be enhanced, and a sufficient distribution space of the antenna feeding lines 220 may be achieved.

The power/data lines 230 may extend on the second portion 210b. The second portion 210b may be bent toward, e.g., a rear portion of the image display device, and may be electrically connected to the main board. Accordingly, a circuit connection of the power/data lines 230 may be easily implemented by using the second portion 210b having a reduced width.

In some embodiments, a distance between the bonding region BR and the chip mounting region CR, or a distance (e.g., the shortest distance) between an upper side of the antenna driving IC chip 280 and the signal pad 126 and 136 in a planar view may be about 20 mm or less. In the above range, a feeding loss to the antenna units 120 and 130 may be efficiently suppressed.

Figure 2:
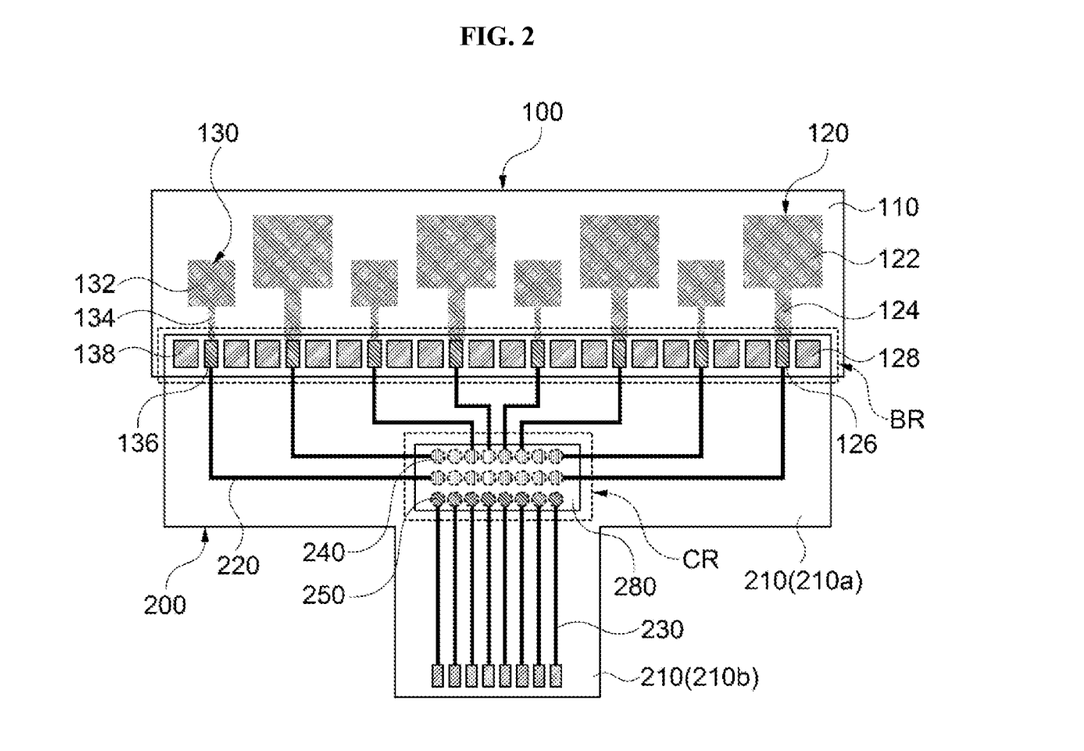
FIG. 2 is a schematic top planar view illustrating an antenna package in accordance with exemplary embodiments.
Figure 3:
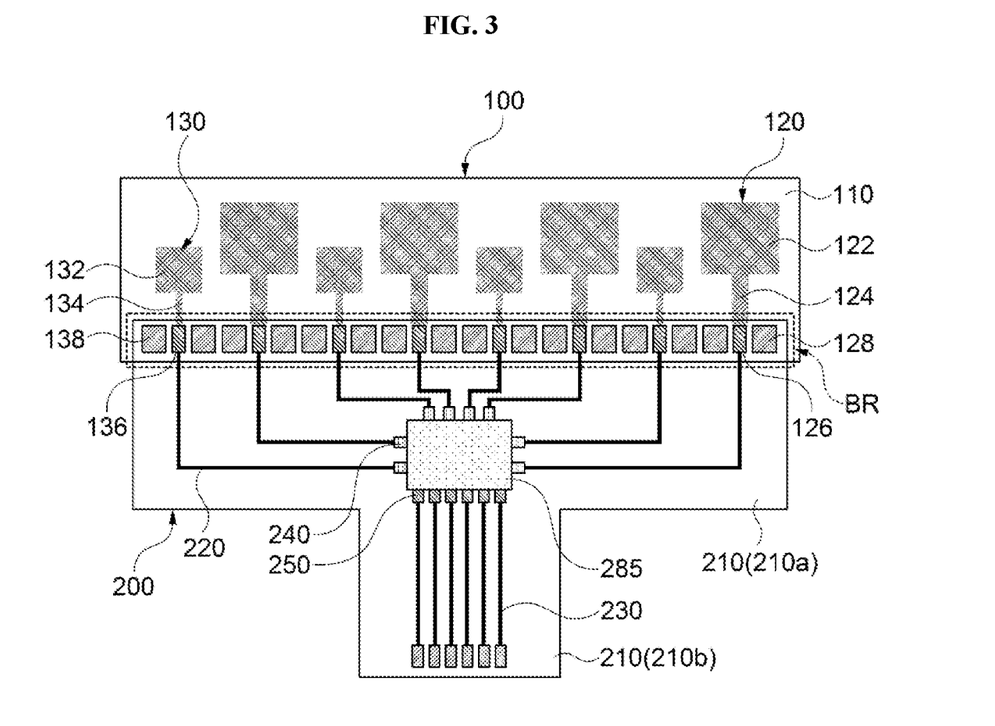
FIG. 3 is a schematic top planar view illustrating an antenna package in accordance with exemplary embodiments.
Figure 4:
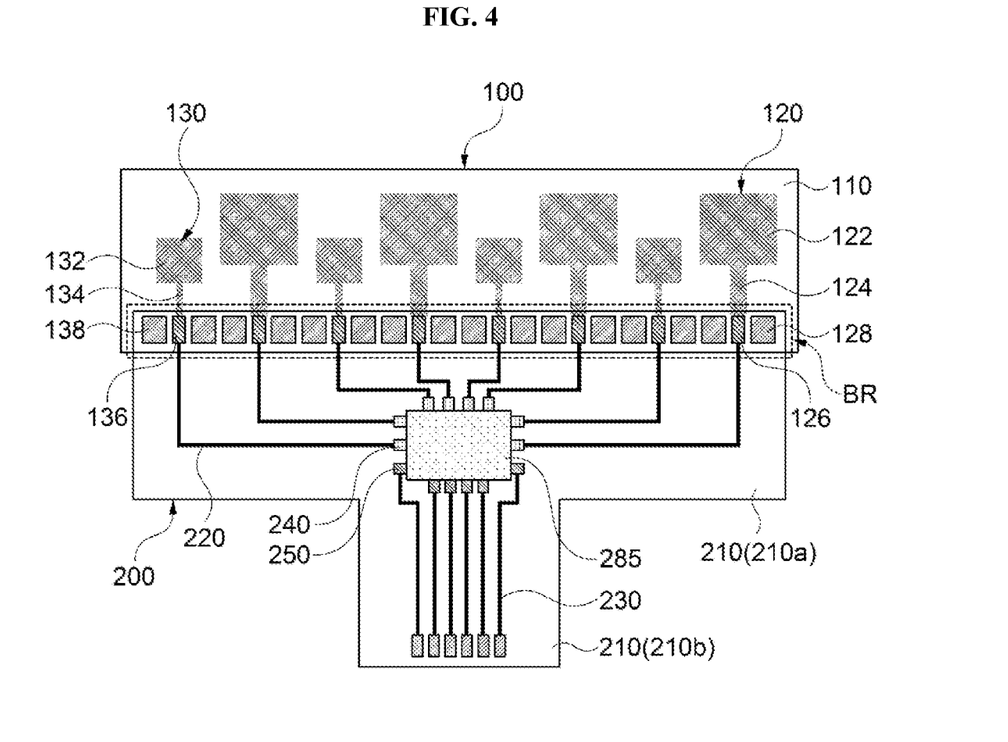
FIG. 4 is a schematic top planar view illustrating an antenna package in accordance with exemplary embodiments.

FIGS. 2 to 4 are schematic top planar views illustrating an antenna package according to exemplary embodiments. Detailed descriptions of elements and/or structures substantially the same as or similar to those described with reference to FIG. 1 are omitted.

Referring to FIG. 2, the antenna feeding ports 240 may also be distributed in a lateral portion the chip mounting region CR or the antenna driving IC chip 280. For example, the antenna feeding ports 240 may form at least two first port rows.

The power/data ports 250 may be disposed at a rear-end portion with respect to the first port rows to form a second port row.

Referring to FIG. 3, the antenna driving IC chip 285 may have a quad flat package (QFP) chip form. For example, ports having a lead shape may protrude from four sides of the antenna driving IC chip 285.

In some embodiments, the antenna feeding ports 240 in the form of the lead may protrude from the upper side (a side adjacent to the bonding area BR) and two lateral sides of the antenna driving IC chip 285 to be connected to each of the antenna feeding lines 220.

The power/data ports 250 may protrude from a lower side of the antenna driving IC chip 285 (ae side facing the upper side and away from the bonding region BR), and may be connected to each of the power/data lines 230.

Referring to FIG. 4, as described above, the antenna driving IC chip 285 may be provided as a QFP chip. The lead-shaped antenna feeding ports 240 may be distributed at the upper side of the antenna driving IC chip 285, and the lead-shaped power/data ports 250 may be distributed at the lower side of the antenna driving IC chip 285.

The antenna feeding port 240 and the power/data port 250 may be distributed together at both lateral sides of the antenna driving IC chip 285. In exemplary embodiments, the power/data ports 250 may be disposed behind the antenna feeding ports 240 in a planar view to be away from the bonding region BR.

In some embodiments, in addition to the above-described BGA or QFP type chip, various types of chips such as DIP (Dual In-line Package), SOP (Small Outline Package), QFN (Quad Flat No Lead), etc., may be employed as the antenna driving IC chip 285.

Figure 5:
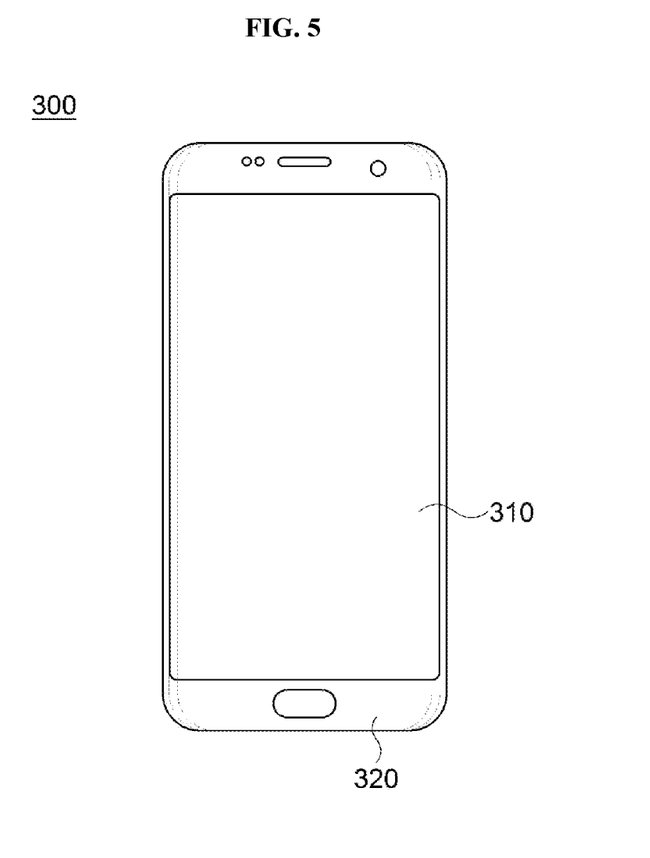
FIG. 5 is a schematic top planar view illustrating an image display device in accordance with exemplary embodiments.

FIG. 5 is a schematic plan view illustrating an image display device in accordance with exemplary embodiments.

Referring to FIG. 5, the image display device 300 may be fabricated in the form of, e.g., a smart phone, and FIG. 5 shows a front face portion or a window surface of the image display device 300. The front face portion of the image display device 300 may include a display area 310 and a peripheral area 320. The peripheral area 320 may correspond to, e.g., a light-shielding portion or a bezel portion of an image display device.

The antenna device 100 included in the above-described antenna package may be disposed toward the front face portion of the image display device 300, and may be disposed on, e.g., a display panel. In an embodiment, the radiators 122 and 132 may be at least partially superimposed over the display area 310 in a planar view.

In this case, the radiators 122 and 132 may have a mesh-pattern structure, and a decrease in transmittance due to the radiators 122 and 132 may be prevented. The antenna driving IC chip 280 included in the antenna package may be disposed in the peripheral area 320 to prevent an image quality from being degraded in the display area 310.

In some embodiments, the antenna package may be bent by the circuit board 200 so that, e.g., the antenna driving IC chip 280 may be disposed on a rear portion of the image display device 300. The power/data line 230 may be bent together with the circuit board 200 or the second portion 210*b* of the core layer 210 to be connected to a main board, an antenna driving module or an application processor (AP) at the rear portion.

As described above, the high-frequency or ultra-high frequency antenna can be effectively applied to the image display device 300 without a signal loss and a mutual interference using the circuit wiring construction on the circuit board 200.

What is claimed is:

1. An antenna package comprising:
   an antenna device comprising:
      an antenna dielectric layer; and
      antenna units disposed on the antenna dielectric layer; and
   a circuit board electrically connected to the antenna units and bonded with the antenna device using an anisotropic conductive film (ACF), the circuit board comprising:
      a core layer;
      antenna feeding lines distributed on a surface of the core layer and connected to the antenna units;
      power/data lines distributed on the surface of the core layer;
      power/data ports connected to end portions of the power/data lines; and
      antenna feeding ports connected to end portions of the antenna feeding lines and arranged to be closer to the antenna units than the power/data ports.

2. The antenna package according to claim 1, wherein the core layer includes a bonding region in which the antenna units and the antenna feeding lines are coupled, and a chip mounting region in which the antenna feeding ports and the power/data ports are distributed.

3. The antenna package according to claim 2, wherein the antenna feeding ports are arranged at a front-end portion of the chip mounting region in a planar view, and the power/data ports are arranged at a rear-end portion of the chip mounting region in the planar view.

4. The antenna package according to claim 3, wherein the chip mounting region has a first port row formed by the antenna feeding ports, and a second port row formed by the power/data ports and disposed behind the first port row with respect to the bonding region.

5. The antenna package according to claim 4, wherein the chip mounting region includes at least two first port rows.

6. The antenna package according to claim 3, further comprising an antenna driving integrated circuit chip having a ball grid array (BGA) structure mounted on the chip mounting region via the antenna feeding ports and the power/data ports.

7. The antenna package according to claim 2, further comprising an antenna driving integrated circuit chip mounted on the chip mounting area in a form of a quad flat package (QFP) chip.

8. The antenna package according to claim 7, wherein the antenna feeding ports and the power/data ports have lead shapes protruding from sides of the antenna driving integrated circuit chip in a planar view.

9. The antenna package according to claim 8, wherein the antenna feeding ports are arranged at an upper side of the antenna driving integrated circuit chip, and the power/data ports are arranged at a lower side of the antenna driving integrated circuit chip.

10. The antenna package according to claim 9, wherein the antenna feeding ports are also arranged at a lateral side of the antenna driving integrated circuit chip.

11. The antenna package according to claim 10, wherein the power/data ports are also arranged at the lateral side of the antenna driving integrated circuit chip and, are disposed behind the antenna feeding ports with respect to the bonding region.

12. The antenna package according to claim 2, wherein the core layer comprises a first portion and a second portion having a width smaller than that of the first portion.

13. The antenna package according to claim 12, wherein the chip mounting region is included in the first portion, and the power/data lines extend on the second portion.

14. The antenna package according to claim 1, wherein the antenna units comprise a first antenna unit and second antenna unit having different sizes from each other.

15. The antenna package according to claim 14, wherein the first antenna unit and the second antenna unit have different resonance frequencies.

16. The antenna package according to claim 14,
   wherein the first antenna unit and the second antenna unit are alternately and repeatedly arranged along a width direction on the antenna dielectric layer.

17. The antenna package according to claim 1, further comprising an antenna driving integrated circuit chip mounted on the power/data ports and the antenna feeding ports of the circuit board, wherein a shortest distance between the antenna driving integrated circuit chip and any one of the antenna units in a planar view is 20 mm or less.

18. An image display device comprising the antenna package according to claim 1.

* * * * *